United States Patent [19]

Kanda et al.

[11] Patent Number: 5,622,813
[45] Date of Patent: Apr. 22, 1997

[54] PHOTOSENSITIVE RESIN COMPOSITION FOR FLEXOGRAPHIC PRINTING PLATE

[75] Inventors: Kazunori Kanda, Yao; Tadashi Hayashi, Hirakata, both of Japan

[73] Assignee: Nippon Paint Co., Ltd., Osaka-fu, Japan

[21] Appl. No.: 361,472

[22] Filed: Dec. 22, 1994

Related U.S. Application Data

[63] Continuation of Ser. No. 8,482, Jan. 25, 1993, abandoned.

[30] Foreign Application Priority Data

Jan. 24, 1992 [JP] Japan ................... 4-010799

[51] Int. Cl.$^6$ ................................... G03C 1/73
[52] U.S. Cl. ................... 430/281.1; 430/270.1; 430/138
[58] Field of Search ................... 430/281, 270, 430/306, 138; 522/120

[56] References Cited

U.S. PATENT DOCUMENTS

| | | | |
|---|---|---|---|
| 4,726,877 | 2/1988 | Fryd et al. | 156/630 |
| 4,956,252 | 9/1990 | Fryd et al. | 430/138 |
| 5,075,192 | 12/1991 | Fryd et al. | 430/138 |

FOREIGN PATENT DOCUMENTS

| | | |
|---|---|---|
| 0237306 | 9/1987 | European Pat. Off. . |
| 0356953 | 3/1990 | European Pat. Off. . |

*Primary Examiner*—George F. Lesmes
*Assistant Examiner*—Laura S. Weiner
*Attorney, Agent, or Firm*—Wenderoth, Lind & Ponack

[57] ABSTRACT

A photosensitive resin composition is provided for flexographic printing plates which has excellent water developability and storage stability. The resin composition comprises (a) 10 to 99 parts by weight of a resin particle having an average particle size of 0.01 to 5 μm, which has a core/shell structure, at least the shell portion of which has a three-dimensionally crosslinked structure, (b) 1 to 90 parts by weight of a compound having a photopolymerizable group, and (c) 0.01 to 10 parts by weight of a photopolymerization initiator, based on the total (100 parts by weight) of the components (a), (b) and (c). The core portion of the resin particle (a) has a Tg of 0° C. or lower, and the shell portion has a Tg of 30° C. or higher.

3 Claims, 2 Drawing Sheets

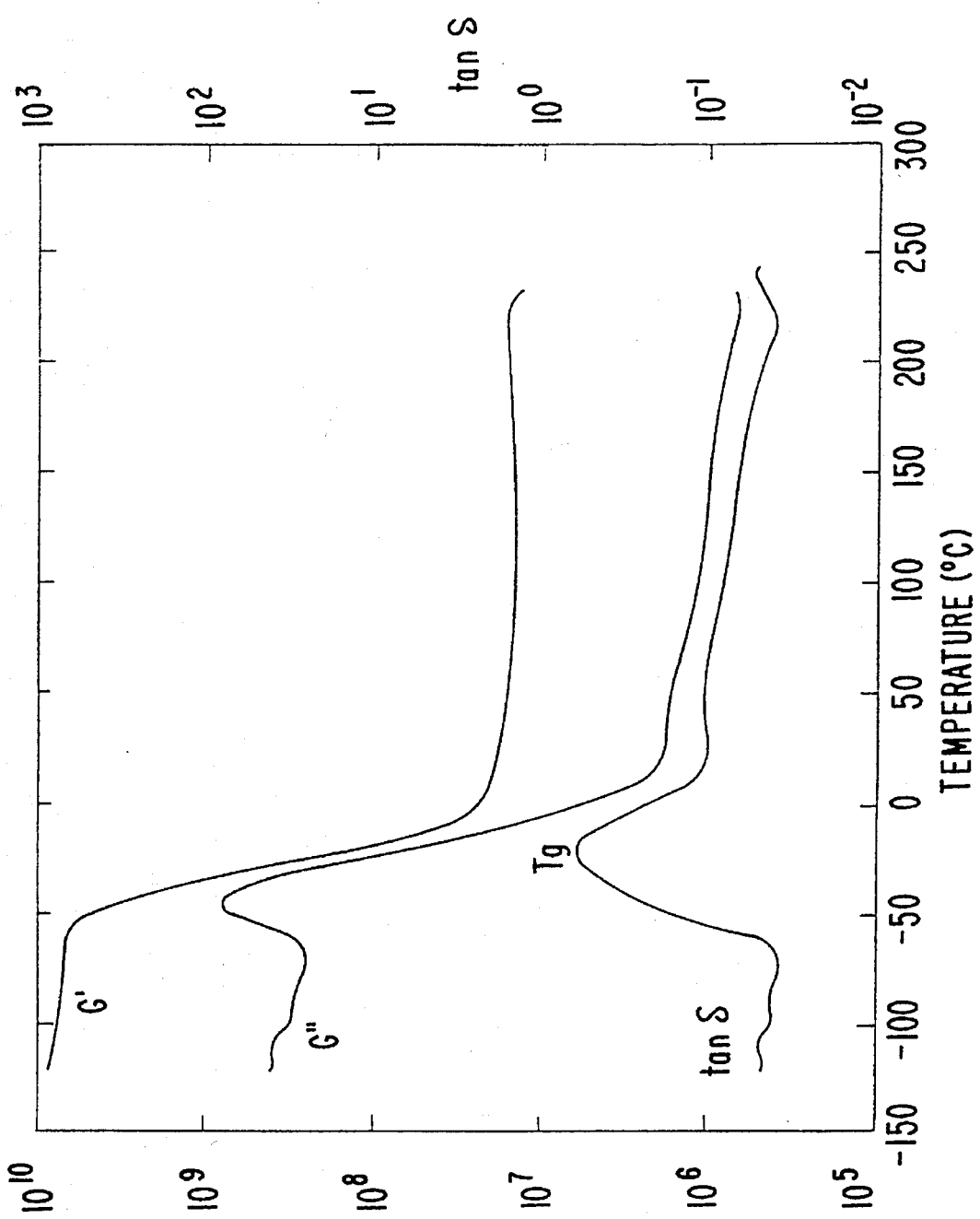

PHOTOSENSITIVE RESIN COMPOSITION FOR FLEXOGRAPHIC PRINTING PLATE

This application is a continuation of now abandoned application, Ser. No. 08/008,482, filed Jan. 25, 1993 abandoned.

BACKGROUND OF THE INVENTION

1. Field of the Invention

The present invention relates to a photosensitive resin composition for a flexographic printing plate.

2. Description of the Related Art

In the field of printing, the importance of a flexographic printing method has become greater and greater because of the diversification of substances to be printed as well the consumer's taste. Further, the importance of a water developable type flexographic printing plate system has recently become greater from the view point of environmental pollution, working conditions and the like.

Heretofore, various photosensitive compositions which provide a water developable flexographic printing plate have been suggested. In a conventional technique, it is required that the constituent resin component have the following characteristic, (1) solubility to water or alkali water, and (2) dispersibility or lubricity to the developer, so as to impart water developability to the composition. A particularly preferred form of the resin is a main binder resin having elasticity in the form of an elastic particle containing a conjugated diene compound as a main component.

Japanese Patent Kokai No. 63-1962712 discloses a conjugated diene copolymer and a photosensitive resin composition obtained by using the same. This conjugated diene copolymer has the particulate form, wherein a three-dimensionally crosslinked structure is continuously distributed from the inside to the outside of the particle. In the case of this particle, it is difficult to design the surface and the three-dimensionally crosslinked structure. Further, storage stability of the resulting flexographic printing plate is inferior and water developability is insufficient.

Furthermore, Japanese Patent Kokai No. 2-175702 discloses a photosensitive composition containing a core/shell type microgel, which can be treated with water. The microgel used is a microgel having a core/shell structure of two layers, wherein only the core portion in the particle has a three-dimensionally crosslinked structure. However, this resin particle has a water swelling property and water resistance of the resulting plate which is inferior. Further, viscosity of the photosensitive composition becomes high on production and strong entanglement of the resin occurs on kneading. Water developability and storage stability of the resulting printing plate are also inferior.

The main object of the present invention is to provide a photosensitive composition which provides a water developable flexographic printing plate. That is, by using a microgel resin having a specific structure, there is provided a photosensitive composition having excellent water developability and storage stability, wherein surface design of the particle is easily conducted and the particle per se has excellent water resistance, whereby, kneading is easily conducted on the production of the plate and solid retention of the plate is superior.

These objects as well as other objects and advantages of the present invention will become apparent to those skilled in the art from the following description with reference to the accompanying drawings.

SUMMARY OF THE INVENTION

According to the present invention, there is provided a photosensitive resin composition for flexographic printing plate, comprising:

(a) 10 to 99 parts by weight of a resin particle having an average particle size of 0.01 to 5 μm, which has a core/shell structure, at least a shell portion of which has a three-dimensionally crosslinked structure, (b) 1 to 90 parts by weight of a compound having a photopolymerizable group, and (c) 0.01 to 10 parts by weight of a photopolymerization initiator, based on the total (100 parts by weight of the components (a), (b) and (c), wherein the core portion of the resin particle (a) has a Tg of 0° C. or lower, and the shell portion has a Tg of 30° C. or higher.

BRIEF EXPLANATION OF DRAWINGS

FIG. 2 is a graph illustrating the results of the measurement of dynamic viscoelasticity of a particle which is obtained by adding a monomer of the shell portion during polymerization of the core portion upon synthesis of a particle of Example 2.

DETAILED DESCRIPTION OF THE INVENTION

Figure 1:
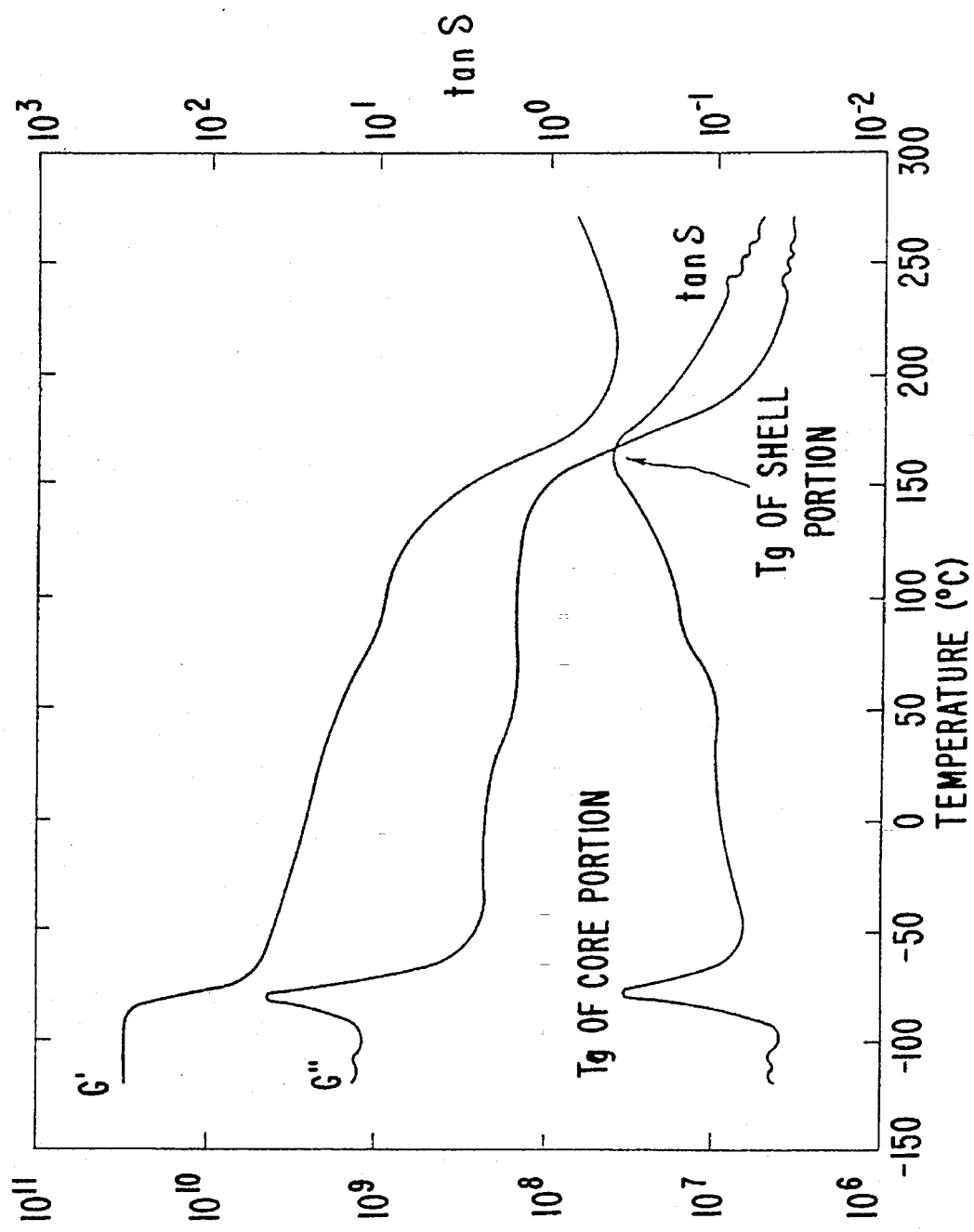
FIG. 1 is a graph illustrating the results of the measurement of dynamic viscoelasticity of a particle obtained in Example 2.

The resin particle (a) used in the present invention has a core/shell structure, at least the shell portion has a three-dimensionally crosslinked structure. Accordingly, a core portion of which may have the three-dimensionally crosslinked structure.

The resin particle (a) is obtained by a two-stage emulsion polymerization process. As the monomer, a monofunctional monomer and a polyfunctional monomer are used. The three-dimensionally crosslinked structure can be obtained by using the polyfunctional monomer. In the present specification, the term "monofunctional" and "polyfunctional" mean that the monomer acts monofunctionally and polyfunctionally in respect to radical emulsion polymerization. More particularly, the monomer "monofunctional" in the case of having one ethylenic vinyl group, and "polyfunctional" in the case of having two or more ethylenic vinyl groups. Further, a conjugated diene monomer acts on the radical emulsion polymerization like the "monofunctional" monomer and, therefore, it is classified as the monofunctional monomer.

Examples of the monomer having monofunctionality include aliphatic conjugated diene monomers (e.g. 1,3-butadiene, isoprene, dimethylbutadiene, 1,3-pentadiene, chloroprene, etc.); carboxyl group-containing monomers (e.g. acrylic acid, methacrylic acid, maleic acid, fumaric acid, tetracosanoic acid, crotonic acid, etc.); hydroxyl group-containing monomers (e.g. 2-hydroxyethyl acrylate, hydroxypropyl acrylate, 2-hydroxyethyl methacrylate, hydroxypropyl methacrylate, hydroxybutyl acrylate, hydroxybutyl methacrylate, allyl alcohol, methallyl alcohol, N-(4-hydroxyphenyl)acrylamide or N-(4-hydroxyphenyl)methacrylamide, o-, m-, p-hydroxystyrene, o-, m-, p-hydroxyphenylacrylate or methacrylate, etc.); alkyl acrylates or methacrylates [e.g. methyl (meth)acrylate, ethyl (meth)acrylate, n-butyl (meth)acrylate, propyl (meth)acrylate,2-ethylhexyl (meth)acrylate, lauryl (meth)acrylate, stearyl (meth)acrylate, acyl (meth)acrylate, cyclohexyl (meth)acrylate, octal acrylate, 2-chloroethyl acrylate, etc.]; polymerizable amides (e.g. acrylamides or methacrylamides such as acrylamide, methacrylamide, N-methylolacrylamide, N-ethylacrylamide, N-hexylacrylamide, N-cyclohexylacrylamide, N-hydroxyethylacrylamide, N-phenylacrylamide, N-nitrophenylacrylamide, N-ethyl-phenylacrylamide, etc.); nitrogen-containing alkyl acrylates or methacrylates (e.g. dimethylaminoethyl acrylate, dimethylaminoethyl methacrylate, etc.); vinyl ethers (e.g. ethyl vinyl ether, 2-chloroethyl vinyl ether, hydroxyethyl vinyl ether, propyl vinyl ether, butyl vinyl ether, octyl vinyl ether, phenyl vinyl ether, etc.); vinyl esters (e.g. vinyl acetate, vinyl chloroacetate, vinyl butylate, vinyl benzoate, etc.); styrenes (e.g. styrene, α-methylstyrene, methylstyrene, chloromethylstyrene, etc.); vinylketones (e.g. methyl vinyl ketone, ethyl vinyl ketone, propyl vinyl ketone, phenyl vinyl ketone, etc.); olefins (e.g. ethylene, propylene, isobutylene, glycidyl(meth)acrylate, etc.); polymerizable nitriles (e.g. acrylonitrile, methacrylonitrile, N-vinylpyrrolidone, N-vinylcarbazole, 4-vinylpyridine, etc.); amphoionic monomers (e.g. N,N-dimethyl-N-methacryloxyethyl-N-(3-sulfopropyl)ammonium-betaine, N,N-dimethyl-N-methacrylamidepropyl-N-(3-sulfopropyl)-ammonium-betaine, 1-(3-sulfopropyl)-2-vinylpyridinium-betaine; monomers having sulfonic or phosphoric group (e.g. vinylsulfonic acid, styrene-p-sulfonic acid, 2-sulfoxyethyl methacrylate, 2-acrylamide-2-methylpropanesulfonic acid etc.); compounds obtained by reacting a compound having a functional group reactive with any of the above monomers (e.g. monomer produced by the reaction of the above hydroxyl group-containing monomer with isocyanate compound, monomer produced by the reaction of the carboxyl group-containing monomer with the glycidyl group-containing monomer, etc,); monomers described in Japanese Patent Application No. 3-36029 and the like. The above compound may be used alone or in combination thereof.

Examples of the polyfunctional monomer include trimethylolpropane di(meth)acrylate, trimethylolpropane tri(meth)acrylate, divinylbenzene, ethylene glycol di(meth)acrylate, pentaerythritol tri(meth)acrylate, pentaerythritol tetra(meth)acrylate, 1,4-butanediol di(meth)acrylate, 1,6-hexanediol di(meth)acrylate, triethylene glycol di(meth)acrylate, tetraethylene glycol di(meth)acrylate, polyethylene glycol di(meth)acrylate, 2,2-bis[4-(methacryoxy polyethoxy)phenyl]propane, 1,3-butylene glycol di(meth)acrylate, neopentyl glycol di(meth)acrylate, pentaerythritol di(meth)acrylate, glycerol di(meth)acrylate, qlycerolallyloxy di(meth)acrylate, 1,1,1-trishydroxymethylethane di(meth)acrylate, 1,1,1-trishydroxymethylethane tri(meth)acrylate, 1,1,1-trishydroxymethylpropane di(meth)acrylate, 1,1,1-trishydroxymethylpropane tri(meth)acrylate, triallyl cyanurate, triallyl isocyanurate, diallyl terephthalate, diallylphthalate and the like. Further, if necessary, two kinds of monomers having an ethylenically unsaturated group which has mutual reactivity can be used in combination. A typical example of this includes epoxy group-containing ethylenically unsaturated monomers (e.g. glycidyl acrylate, glycidyl methacrylate, etc.) and carboxyl group-containing ethylenically unsaturated monomers (e.g. acrylic acid, methacrylic acid, crotonic acid, etc.). However, the group having mutual reactivity is not specifically limited, and various combinations, for example, amine and carbonyl, epoxy and carboxylic anhydride, amine and carboxylic acid chloride, alkylimine and carbonyl, organoalkoxysilane and carbonyl, hydroxyl and isocyanate and the like may be used.

The resin particle (a) used in the present invention consists of a core portion as the center and a shell portion for covering said core portion. It is essential for this particle that the shell portion has a three-dimensionally crosslinked structure.

The resin particle having a core/shell structure is synthesized by a two-stage reaction. In the first stage, a core portion is synthesized and, in the second stage, a shell portion is synthesized.

The reaction of the first stage is conducted by a normal emulsion polymerization process. For example, there can be used a method for preparing the core portion by emulsion-polymerizing the monomer mixture in the presence of a surfactant, using an equipment such as a pressure vessel. More particularly, it is prepared by emulsion-polymerizing the monomer mixture at a temperature of about 15° to 20° C. in an aqueous medium which contains paramethane peroxide as an initiator and dismutated calcium rosinate as an emulsifier. These emulsion polymerization can be conducted by a technique which is known as a polymerization method of rubber latex. For example, the emulsion polymerization may be conducted by a technique disclosed in Japanese Patent Kokai Nos. 63-162712, 61-181811, 61-95349, 60-219208 and 1-300246, and Japanese Patent Application No. 3-36029. In addition to the monomer, additives such as surfactant, polymerization initiator, chain transfer agent, short-stop, polymerization stabilizer and the like may be used.

Particularly, in the case of using a monomer having a diene structure, the emulsion polymerization is conducted under pressure, using a pressure vessel. In order to distinguish the core portion from the shell portion structurally, it is necessary that the polymerization reaction of the first stage be perfectly terminated and then the synthesis of the shell portion be started after the structure of the core portion is confirmed.

After the reaction has been completed, the reaction can be terminated, using a method of adding a short-stop (1), a method of terminating a polymerization reaction of a monomer perfectly (2), a method of terminating a radical reaction by decreasing a reaction temperature (3), and a method of consuming both monomer and initiator for a long period of polymerization time (4) alone or in combination thereof. The residual unreacted monomer after the reaction of the first stage is removed by a vacuum method, stripping method due to blowing of vapor and the like, unless the residual monomer is used in the second stage.

Similarly, the synthesis of the shell portion in the seconds stage is conducted by the emulsion polymerization process. As the polymerization method, there can be used a method which is normally used in the synthesis of a core/shell type emulsion or the synthesis of an emulsion by a seed polymerization.

The synthesis of the shell can be conducted in the same reaction vessel or another vessel using the emulsion of which monomer is removed if necessary, after the synthesis reaction of the core portion is terminated. The reaction may be conducted under normal pressure or under pressure.

In the case of starting the polymerization, an emulsifier may be further added. The concentration should be sufficiently controlled such that other particles are not newly formed by a monomer to be added in the polymerization of the second stage and, further, the resin is stably synthesized.

The polymerization reaction is conducted by adding a monomer and an initiator. The reaction can be terminated according to the same method as that of the first stage.

In order to use the resin particle in a photosensitive composition, the resin particle must be dehydrated to form a solid state after the completion of the emulsion polymerization. For this purpose, there can be used a method wherein an emulsion is solidified by adding a large amount of an electrolyte to form a precipitate according to a salting-out method, followed by drying, or a method wherein an aqueous medium is removed directly by a freeze drying method or spray drying method.

The following methods can be used to confirm whether the three-dimensionally crosslinked resin particle has the core/shell structure or not.

(1) Confirmation of shape of particle:

By the observation of a particle according to electron microscopy and the measurement of particle size according to a laser beam scattering method, it can be confirmed whether particles having various structures and particle sizes are formed or not after the completion of the two-stage reaction. It is also confirmed that the particle size of the particle increases according to monomer compositional ratios at the first stage and second stage.

(2) Confirmation of mechanical properties of particle:

It can be confirmed that a synthesized particle comprises a core portion and a shell portion, said portion having different physical properties, and at least the shell portion has a core/shell structure of a three-dimensionally crosslinked structure. As the method, DMA (Dynamic Mechanical Analysis) method is most suitable. There are also the TMA method and the DSC method, however, according to these methods, precise data can not be obtained when the proportion of the shell portion is small in comparison with the core portion. Further, there is a problem that accuracy of the experiment is inferior. The measurement can be easily conducted, using a film obtained by purifying the resin particle into a solid resin, followed by pressing.

The construction of the core/shell portion of the resin particle can be determined by measuring Tg. According to the DMA method, Tan $\delta$ generally corresponds to Tg of a polymer, and the value is used as Tg of the core and shell portion.

The resin particle used in the present invention is characterized in that two Tg values derived from the core and shell portion can be observed. Particularly, when the diene monomer is used for the core portion, characteristic Tg values derived from the core and shell portion are observed at about −90° to −30° C. and 30° to 200° C., respectively.

Design of the core/shell is classified whether the three-dimensionally crosslinked structure (gelation structure) is present or not. The ratio (weight ratio) of the core portion to the shell portion is 20:80 to 99:1, preferably 30:70 to 95:5. When the ratio of the core portion is smaller than the above range, a resin particle having poor elasticity is liable to be obtained. Further, when a printing plate is produced, flexibility of the plate becomes low and the plate has no toughness. When the ratio of the core portion is larger than the above range, the resin particles lack stability and, therefore, the resin particles are liable to be fused to each other on purifying or kneading. Further, the resulting printing plate is inferior in adhesion, solid property, water developability and storage stability.

(1) Particle design in the case of non-three-dimensionally/three-dimensionally crosslinked structure The core portion is synthesized from at least one monomer selected from monofunctional monomers. The shell portion is synthesized from a mixture of at least one monofunctional monomer and a polyfunctional monomer.

Regarding the core portion, elasticity is required and, therefore, the core portion can be designed by selecting a monomer having low Tg or a monomer having a conjugated diene bond. Preferred examples include monomers which provide polymer having Tg of 0° C. or lower (e.g. n-butyl acrylate, 2-ethylhexyl acrylate, ethyl acrylate, lauryl acrylate, stearyl acrylate, etc.), and homopolymers or copolymers of monomer having an aliphatic conjugated diene structure are also suitable. The amount of the monomer having an aliphatic conjugated diene structure is at least 40%, preferably not less than 60%, more preferably not less than 80%. Tg of the core portion is not higher than 0° C., preferably −30° to −90° C., more preferably −50° to −85° C. If these conditions are not satisfied, the resulting resin particle is not suitable for a flexographic printing material.

Regarding the shell portion, a three-dimensionally crosslinking property is required. The ratio of the monofunctional polymer to the polyfunctional polymer is 0:80 to 99:1, preferably 40:60 to 95:5.

When the amount of the polyfunctional monomer is small, three-dimensionally crosslinking is insufficient and, therefore, the resin particle is destroyed by thermal or mechanical energy and agglomerated or fused, which results in remarkable deterioration of dispersibility. Further, when the amount is too large, a resin particle which can not make the best use of elasticity of the core portion is obtained, and impact resilience of the resulting printing plate is remarkably lowered. Tg of the shell portion is not lower than 30° C., preferably not lower than 80° C., more preferably not lower than 100° C. If these conditions are not satisfied, the resulting resin particle lacks stability, which is not suitable for a flexographic printing material.

(2) Particle design in the case of three-dimensionally/three-dimensionally crosslinked structure Both core and shell portions are synthesized from a mixture of at least one monofunctional monomer and a polyfunctional monomer.

In the core portion, the ratio of the monofunctional monomer to the polyfunctional monomer is 50:50 to 99.5:0.5, preferably 70:30 to 90:1. The amount of the monomer having an aliphatic conjugated diene structure is at least 40%, preferably not less than 60%, more preferably not less than 80%. Tg of the core portion is not higher than 0° C., preferably −20° to −90° C., most preferably −30° to −80° C. If these conditions are not satisfied, the resulting resin particle is not suitable for a flexographic printing plate.

When the amount of the polyfunctional monomer is large, elasticity of the core portion becomes insufficient and the printing plate having excellent flexibility and elasticity can not be obtained.

In the shell portion, the ratio of the monofunctional monomer to the polyfunctional monomer is 50:50 to 99:1, preferably 70:30 to 95:5.

When the amount of the polyfunctional monomer is small, three-dimensionally crosslinking is insufficient and, therefore, the resin particle is destroyed by thermal or mechanical energy and agglomerated or fused, which results in remarkable deterioration of dispersibility. Further, when the amount is too large, a resin particle which can not make the best use of elasticity of the core portion is obtained, and impact resilience of the resulting printing plate is remarkably lowered, Tg of the shell portion is not lower than 30° C., preferably not lower than 80° C., more preferably not less than 100° C. If these conditions are not satisfied, the resulting resin particle lacks stability, which is not suitable for a flexographic printing material.

It is preferred that the particle size of the resin particle (a) is 0.01 to 5 μm, preferably 0.05 to 0.5 μm. When the particle size is too large or too small, the resulting printing material does not show excellent elasticity and developability, and it is not preferred. As a matter of course, the particle size after the polymerization at the second stage of the shell portion is large in comparison with the particle size after the polymerization at the first stage of the core portion. In order to obtain water developability of the resin particle, it is effective to use a monomer having a carboxyl group, sulfonic group, phosphoric group or amphoionic group as the monofunctional monomer on the synthesis of the shell. In that case, the amount is preferably about 1 to 50%, based on the amount of the monomer composing the shell portion.

The characteristics of the core/shell structure of the resin particle (a) are as follows.

(1) Since the polymerization is conducted by two-stage reaction, the surface design of the particle can be easily conducted by the synthesis of the shell.

(2) Since the core portion has elasticity and the shell portion is gelled, the resulting elastic resin has a particle structure which is stable against an external force and heat and, therefore, it can be stably treated without being thickened even by heating or kneading.

(3) Since the shell portion has a crosslinked structure, fusion between particles are prevented and the resulting printing material has excellent solid retention, adhesion resistance and water developability.

As the compound (b) having a photopolymerizable or photoreactive group, an ethylenically unsaturated monomer can be used. The photopolymerizable ethylenically unsaturated monomer imparts higher water resistance to a printing plate. Examples of the monomer include compounds having an ethylenically unsaturated group, preferably containing polyfunctional monomer. In the resin system of the present invention, the polyfunctional monomer imparts water resistance to the printing plate but does not inhibit water developability of the resin plate. As the monomer, there can be used the above monomers used in the case of synthesizing the core/shell three-dimensionally crosslinked polymer particle, polyfunctional polymers having good compatibility with the resin system, for example, those described hereinafter, or those described in U.S. Pat. No. 3,801,328, etc. Examples of the monomer include unsaturated carboxylates [e.g. n-butyl (meth)acrylate, 2-ethylhexyl (meth)acrylate, lauryl (meth)acrylate, stearyl (meth)acrylate, polyethylene glycol mono(meth)acrylate, methoxypolyethylene glycol mono(meth)acrylate, polypropylene glycol mono(meth)acrylate, phenoxypolyethylene glycol mono(meth)acrylate, ethylene glycol di(meth)acrylate, diethylene glycol di(meth)acrylate, triethylene glycol di(meth)acrylate, polyethylene glycol di(meth)acrylate, methoxypolyethylene glycol di(meth)acrylate, polypropylene di(meth)acrylate, diallyl itaconate, glycerol di(meth)acrylate, glycerol tri(meth)acrylate, 1,3-propylene glycol di(meth)acrylate, 1,4-cyclohexanediol di(meth)acrylate, 1,2,4-butanetriol tri(meth)acrylate, glycerol polypropylene glycol tri(meth)acrylate, 1,4-benzenediol di(meth)acrylate, pentaerythritol tetra(meth)acrylate, tetramethylene glycol di(meth)acrylate, 1,5-pentanediol di(meth)acrylate, 1,6-hexanediol di(meth)acrylate, etc.]; unsaturated amides [e.g. methylene bis(meth)acrylamide, ethylene bis(meth)acrylamide, 1,6-hexamethylene bis(meth)acrylamide, diethylenetriamine tris(meth)acrylamide, N-(hydroxymethyl)acrylamide, N-(hydroxymethyl)methacrylamide, N-(β-hydroxyethyl)acrylamide, N-(β-hydroxyethyl)methacrylamide, N,N-bis(β-hydroxyethyl)acrylamide, N,N-bis(β-hydroxyethyl)methacrylamide, etc.]; divinyl esters [e.g. divinyl adipate, divinyl phthalate, etc.]; acrylated or methacrylated urethanes (these are derived from hydroxyalkyl acrylate or hydroxyalkyl methacrylate and isocyanate compound); products of diacrylate or dimethacrylate or aromatic compound and a polyhydric alcohol [e.g. diepoxypolyether derived from bisphenol or a novolak compound, etc.]; polyester mono/di(meth)acrylates and polyether mono/di(meth)acrylates and the like. They are used alone or in combination thereof, and water-soluble or water-dispersible monomers are generally preferred.

Examples of the photopolymerizable initiator (c) include benzoin ethers [e.g. benzoin isopropyl ether, benzoin isobutyl ether, etc.]; benzophenones [e.g. benzepbenone, methyl-o-benzoin benzoate, 4,4'-bis(dimethylamino)-benzophenone, etc.]; xanthones [e.g. xanthone, thioxanthone, 2-chlorothioxanthone, etc.,]; acetophenones [e.g. acetophenone, trichloroacetophenone, 2,2-diethoxyacetophenone, 2,2-dimethoxy-2-phenylacetophenone, etc.]; benzyl; 2-ethylanthraguinone; methylbenzoyl formate; 2-hydroxy-2-methyl-propionphenone; 2-hydroxy-2-methyl-4'-isopropyl-isopropiophenone; 1-hydroxycyclohexyl phenyl ketone and the like. They are used alone or in combination thereof.

In addition to the above components (a), (b) and (c), the photosensitive resin composition of the present invention normally contains a hydrophilic and/or hydrophobic binder polymer (d) and a basic nitrogen atom-containing compound (e).

The hydrophilic binder polymer (d) formulated in the photosensitive resin composition of the present invention contains a hydrophilic functional group and it has a molecular weight of 1,000 to 1,000,000, preferably 5,000 to 500,000. The hydrophilic binder polymer can be prepared by modifying a suitable polymer (e.g. polymer of conjugated diene hydrocarbon, copolymer of conjugated diene hydrocarbon with a monoolefin unsaturated compound, polymer containing no conjugates diene hydrocarbon, etc.) with carboxylic acid, sulfonic acid or amine to introduced a hydrophilic functional group (e.g. carboxylic group, sulfonic group, amine group, etc.) into the polymer. Further, hydrophilic nature of the polymer is represented by an acid value or amine value of the polymer, and it is preferred that the value is 2 to 200, particularly 20 to 80. When the value is smaller than the above range, water developability is insufficient. When the value exceeds the above range, sufficient physical property and image quality can not be obtained.

As the above suitable polymer used for preparing the hydrophilic binder polymer (d), for example, there are polymer of conjugated diene hydrocarbon, copolymer or block copolymer of conjugated diene hydrocarbon with monoolefinic hydrocarbon and the like. Examples thereof include butadiene polymer, isoprene polymer, chloroprene polymer, styrene-butadiene copolymer, styrene-isoprene copolymer, styrene-chloroprene copolymer, acrylonitrile-butadiene copolymer, acrylonitrile-isoprene copolymer, acrylonitrile-chloroprene copolymer, methyl methacrylate-butadiene copolymer, methyl methacrylate-isoprene copolymer, methyl methacrylate-chloroprene copolymer, methyl acrylate-butadine copolymer, methyl acrylate-isoprene copolymer, methyl acrylate-chloroprene copolymer, acrylonitrile-butadiene-styrene copolymer, acrylonitrile-isoprene-styrene copolymer, acrylonitrile-chloroprene-styrene copolymer, diblock copolymers (e.g. polystyrene-polyisoprene, polystyrene-polybutadiene, polyisoprene-polybutadiene, etc.), block copolymers (e.g. polystyrene-polybutadiene-polystyrene, polystyrene-polyisoprene-polystyrene, polystyrene-polyethylene/butylene-polystyrene, etc.), epichlorohydrin polymer, epichlorohydrin-ethylene oxide copolymer, epichlorohydrin-propylene oxide copolymer and/or epichlorohydrin rubber which is a copolymer of the above polymer with allylglycidyl ether, polymers containing no conjugated diene hydrocarbon (e.g. chlorinated polyethylene, vinyl chloride copolymer, vinylidene chloride, polypropylene chloride, chlorinated ethylene-propylene rubber and the like. Further, an acidic or basic monomer can be directly introduced on the synthesis of these polymers.

Examples of the hydrophilic polymer are maleic acid half ester modified hydrophilic polymers obtained by maleinating the above polymer or copolymer, followed by half-esterifying with alcohols and/or a $\alpha,\beta$-ethylenically unsaturated monomer having hydroxyl group. By introducing an $\alpha,\beta$-ethylenically unsaturated monomer having the hydroxyl group, photopolymerization property is imparted to the hydrophilic polymer and, therefore, the mechanical property of a film is improved. Examples of the preferred alcohols include methanol, ethanol, butanol, propanol, lauryl alcohol and the like. As the $\alpha,\beta$-ethylenically unsaturated monomer having hydroxyl group, for example, there are 2-hydroxylethyl acrylate, hydroxypropyl acrylate, 2-hydroxyethyl methacrylate, hydroxypropyl methacrylate, hydroxybutyl acrylate, hydroxybutyl methacrylate, allyl alcohol, methallyl alcohol, N-(4-hydroxyphenyl)acrylamide or N-(4-hydroxyphenyl)methacrylamide, o-, m-, p-hydroxystyrene, o-, m-, p-hydroxyphenyl acrylate or methacrylate and the like. Preferred monomers are 2-hydroxyethyl (meth)acrylate and hydroxypropyl (meth)acrylate.

As the other hydrophilic polymer, there are amine modifications of the above suitable diene polymer/copolymers. Examples thereof include cationic polybutadiene obtained by introducing an oxirane group into a 1,2-vinyl group of polybutadine with per acid (e.g. peracetic acid), ring-opening the oxirane group with amine to introduced an amine group and neutralizing the amine group. This modification method is used for the modification of a resin for electrodeposition paint.

As the other hydrophilic polymer, there are hydrophilized polymers obtained by modifying the above suitable polymer containing no conjugated diene hydrocarbon with carboxylic acid, sulfonic acid or amine; carboxyl group-containing polyurethanes; carboxyl group-containing polyureaurethanes; carboxyl group-containing polyesters; carboxyl group-containing polyamides; sodium polyacrylates and the like. Further, polyacrylamide, polyvinyl alcohol, carboxymethylcellulose, hydroxyethylcellulose, methylcellulose, polyethylene oxide, polypropylene oxide, polytetramethylne glycol, polyethylene imine and the like can be used in combination. Preferred hydrophilic polymer are those obtained by maleinating polymers of conjugated diene hydrocarbon and copolymers of conjugated diene hydrocarbon with monoolefin unsaturated compound, followed by modifying with alcohols and/or an $\alpha,\beta$-ethylenically unsaturated monomer having alcohol and/or hydroxyl group. As the polymer, for example, butadiene polymer, isoprene polymer, styrene-butadine polymer, styrene-isoprene copolymer, polystyrene-polybutadiene copolymer, polystyrene-polyisoprene block copolymer, polystyrene-polyisoprenepolystyrene block copolymer can be used, preferably.

The hydrophobic polymer contains at least 30 mol %, preferably at least 40 mol % of a conjugated diene monomer unit in a molecule, and it has a molecular weight of 5,000 to 1,000,000, preferably 10,000 to 500,000 and at least one glass transition temperature of not higher than 5° C., preferably not higher than −5° C., most preferably not higher than −30° C. When the amount of the conjugated diene monomer unit is small, elasticity, flexibility and image quality of the resulting composition are deteriorated. Further, when the molecular weight is small, a composition having sufficient water developability and image quality can not be obtained. Examples of the hydrophobic polymer include polymers of conjugated diene hydrocarbon and/or copolymers of conjugated diene hydrocarbon with a monoolefinic unsaturated compound. They are prepared by a method known to the art.

As the conjugated diene hydrocarbon used for the preparation of the hydrophobic polymer, there are 1,3-butadiene, isoprene, chloroprene and the like, and one or more sorts of them may be used. Examples of the monoolefin unsaturated compound include styrene, $\alpha$-methylstyrene, o-methylstyrene, m-methylstyrene, p-methylstyrene, acrylonitrile, methacrylonitrile, vinyl chloride, vinylidine chloride, acrylamide, metacrylamide, vinyl acetate, acrylate, methacrylate and the like. In the combination of the conjugated diene hydrocarbon with the monoolefinic unsaturated compound, those which form a structure of block copolymer are preferred.

Examples of the hydrophobic polymer include butadiene polymer, isoprene polymer, chloroprene polymer, styrene-butadine copolymer, styrene-isoprene copolymer, styrene-chloroprene copolymer, acrylonitrile-butadiene copolymer, acrylonitrile-isoprene copolymer, acrylonitrile-chloroprene copolymer, methyl methacrylate-butadiene copolymer, methyl methacrylate-isoprene copolymer, methyl methacrylate-chloroprene copolymer, methyl acrylate-butadiene copolymer, methyl acrylate-isoprene copolymer, methyl acrylate-chloroprene copolymer, acrylonitrile-butadine-styrene copolymer, acrylonitrile-chloroprene-styrene copolymer, acrylonitrile-chloroprene-styrene copolymer, polystyrene-polybutadine block copolymer, diblock copolymer (e.g. polystyrene-polybutadiene, polystyrene-polyisoprene, polyisoprene-polybutadine, etc.), block copolymer (e.g. polystyrene-polybutadiene-polystyrene, polystyrene-polyisoprene-polystyrene, polystyrene-polyethylene-polystyrene, etc.) and the like.

Preferably, the basic nitrogen atom-containing compound (e) is a compound which has a tertiary basic nitrogen atom and a vinyl group. The compound (e) is generally represented by the formula:

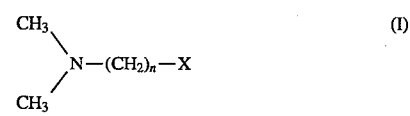

wherein n is 1, 2 or 3, X is —O—CO—CR=CH$_2$, —NH—CO—CR=CH$_2$ or —O—CO—N4—CO—CR=CH$_2$, R is a hydrogen atom or a methyl group; or

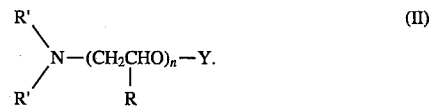

wherein Y is a hydrogen atom or $$-CO-CR=CH_2 \text{ or } -CO-NH-CO-CR=CH_2, \text{ or}$$

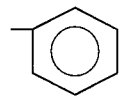

, R is a hydrogen atom or a methyl group, provided that when R' is a methyl group, n is an integer of 1 to 6 and when R' is an ethyl group, n is an integer of 2 to 6. The compounds (I) and (II) are preferred in the present invention. However, when Y is a hydrogen atom in the compound (II), it is not preferred. Preferred examples of the compound include N,N-dimethylaminoethyl (meth)acrylate, N,N-dimethylaminopropyl (meth)acrylamide, N,N-dimethyl aminoethyl-N'-(meth)acryloylcarbamate, N,N-diethylaminoethyl (meth)acrylate, N,N-dimethylaminoethoxy ethanol, N,N-diethylaminoethoxyethanol and mixture thereof. The other non-photopolymerizable amine compound, for example, 2-N-morpholiethanol and 2-piperidinoethanol may be combined with the above compounds (I) and (II). A monoamine, diamine and triamine compound having higher than 50° C. boiling point may be used.

If necessary, the photosensitive resin composition of the present invention may contain additives, for example, a thermal-polymerization inhibitor in an amount of 0.001 to 2.0% by weight, based on the solid content of the photosensitive resin composition. Examples of the inhibitor include hydroquinone, hydroquinone monomethyl ether, mono-t-butylhydroquinone, catechol, p-t-butylcatechol, 2,6-di-t-butyl-p-cresol, benzoquinone, 2,5-diphenyl-p-benzoguinone, p-methoxyphenol, t-butylpyrocatechol, pyrogallol, β-napthol, naphthol, 2,6-di-t-butyl-p-cresol, phenothiazine, pyridine, nitrobenzene, dinitrobenzene, a nitroso dimer inhibitor as described in U.K. Patent No. 1,453,681 and a bis(substituted amino)sulfide as described in U.S. Pat. No. 4,168,981. As the other useful inhibitor, there are p-toluquinone, chloranyl and thiazine dye, Eor example, thiocyanine blue G (CI 52025), methylene blue B (CI 52015) and toluidine blue (CI 52040). Such the composition can be photopolymerized without removing the inhibitor. Preferred inhibitor includes 2,6-di-t-butyl -4-methylphenyl and p-methoxyphenol.

In the phosensitive resin composition of the present invention, in order to prevent aging due to oxygen, ozone and the like, a suitable amount of a known antioxidant and/or an antiozonant may be formulated. Examples of the antioxidant include alkylated phenols [e.g. 2,6-di-t-butyl-4-methyl phenol, etc.], alkylated bisphenols [e.g. 2,2-methylenebis( 4-methyl-6-t-butylpbenol), etc.], 1,3,5-trimethyl-2,4,6-tris-(3,5-di-t-butyl-4-hydroxybenzyl)benzene, 2,4-hydroxy-3,5-di-t-butylaniline, 4,6-bis(n-octylthio)-1,3,5-triazine, polymeric trimethyl dihydroquinone, dilaurylthio dipropionate and the like. Examples of the antiozonant include microcrystalline wax, paraffin wax, dibutylthiourea, 1,1,3,3-tetramethyl-2-thiourea, antiozonant AFD (manufactured by Nafton Co.), norbornene (e.g. di-5-norbornene-2-methyl adipate, di-5-norbornene-2-methyl maleate, di-5-norbornene-2-methyl terephthalate, etc.), Ozon Protector 80 (manufactured by Reichfold Chemical Co.), N-phenyl-2-naphthylamine, unsaturated vegetable oil (e.g rapeseed oil, linseed oil, safflower oil, etc.), polymer or resin (e.g. ethylene/vinyl acetate copolymer resin, chlorinated polyethylene, chlorosulfonated polyethylene, chlorinated ethylene/metacrylic acid copolymer, polyurethane, polypentadiene, polybutadiene, furfural derived resin, ethylene/propylene/diene rubber, diethylene glycol ester of rosin, α-methylstyrene/vinyltoluene copolymer, etc.) and the like.

If necessary, the photosensitive resin composition of the present invention may contains organic or inorganic filler or reinforcer, which is transparent to the light to be exposed and does not scatter it. The filler can be immiscible with the resin composition and be polymeric or non-polymeric, including polystyrene, internal three-dimensionally resin microparticle (microgel), organic affinity silica, bentonite, silica, glass powder, colloid carbon, a variety of dyes or pigments and mixtures thereof. The amount of the filler can be varied by the desired properties of the elastic resin composition. The filler is useful for an improvement of strength of the composition, a reduction of tack (adhesion) and as a colorant.

The plasticizer can be added to the composition to reduce the glass transition temperature of the composition, thus enhancing developability. Typical examples of the plasticizers include dialkyl phthalate, alkylphosphate, polyethylene glycol, polyethylene glycol ester and polyethylene glycol ether.

In the photosensitive resin composition of the present invention, the amount of a crosslinked resin particle (a), a compound having a photoreactive group (b), a photopolymerization initiator (c), a hydrophilic and/or hydrophobic binder polymer (d) and a basic nitrogen atom-containing compound (e) is 10 to 99 parts by weight (preferably 30 to 90 parts by weight), 1 to 90 parts by weight (preferably 10 to 60 parts by weight), 0.01 to 10 parts by weight (preferably 0.05 to 5 parts by weight), 0 to 50 parts by weight (preferably 0 to 30 parts by weight), 0 to 30 parts by weight (preferably 0 to 20 parts by weight), respectively, based on the total weight (100 parts by weight) of the components (a) to (e). When the amount of the resin particle (a) is smaller than 10 parts by weight, solid retention of the printing material can not be obtained. Further, the amount exceeding 99 parts by weight has a bad influence upon the strength of the printing plate after the formation of the image. When the amount of the compound (b) is smaller than 1 part by weight, the product is not completely cured and the amount exceeding 90 parts by weight has a bad influence upon the Size retention of the printing material. When the amount of the photopolymerization initiator (c) is smaller than 0.01 parts by weight, sufficient hardness is not obtained and, when the amount exceeds 10 parts by weight, the exposure latitude becomes narrow and film strength after the formation of the image is deteriorated. When the amount of the binder polymer (d) is larger than 50 parts by weight, water resistance is deteriorated in the case of the hydrophilic binder polymer and water developability is deteriorated in the case of the hydrophobic binder polymer. When the basic nitrogen atom-containing compound (e) exceeds 30 parts by weight, water resistance of the printing plate becomes inferior. The preparation of the photosensitive resin composition of the present invention is not specially limited and the composition can be obtained by mixing the above components, uniformly.

The photosensitive resin composition of the present invention can be used for the production of a resin plate for flexographic printing. That is, the photosensitive resin plate thus obtained is formed in a suitable shape (e.g. sheet or plate) on a substrate by a conventional method (e.g. extrusion molding or calendering) to obtain a resin plate for flexographic printing. Examples of the substrate include plastic plate, plastic sheet, rubber sheet, expanded olefin sheet, expanded rubber sheet, expanded urethane sheet, metal plate, metal sheet and the like. If necessary, an adhesive may be applied on the substrate.

The obtained resin plate for flexographic printing is firstly exposed to chemical light sources through a negative film and polymerized at light-exposed portions to form latent images. A typical example of the chemical light source is ultraviolet light. The exposed resin plate is developed and rinsed with water to yield relief images. The obtained plate is then dried and post-exposed to the light sources to give a flexographic printing plate which has excellent image reproducibility, water resistance, rubber resilience and mechanical strength. The printing plate is suitable for commercial flexographic printing because of its excellent water developability and durability. The ozone resistance of the flexographic printing plate may also be improved by annealing the plate at an elevated temperature before use, The present invention is illustrated by the following Examples which, however, are not to be construed as limiting the present invention to their details. In Examples, all "parts" are based on weight unless otherwise indicated.

Example 1

Synthesis of core portion

By using the following monomers and a reagent for polymerization, a core portion was polymerized. The polymerization was conducted in a 2 liter glass reaction vessel at 80° C.

| Component | Parts |
| --- | --- |
| n-Butyl acrylate | 90 |
| Methyl acrylate | 10 |
| Water | 300 |
| Sodium dodecylbenzenesulfonic acid | 1.0 |
| 2,2-Azobis[2-methyl-N-(2-hydroxyethyl)-propionamide] | 1.0 |

After confirming that a polymerization degree of the total monomers added In a polymerization system has reached 100%, the polymerization system was cooled.

Synthesis of shell portion

Thereafter, by using the following monomers and a reagent for polymerization, a shell portion was polymerized. The polymerization was continuously conducted in the 2 liter glass reaction vessel which contains an emulsion of the core portion.

| Component | Parts |
| --- | --- |
| Emulsion of core portion | 402 |
| n-Butyl acrylate | 5 |
| Methyl methacrylate | 15 |
| Ethylene glycol dimethacrylate | 5 |
| Water | 200 |
| 4,4'-Azobisisocyanovaleric acid | 0.3 |
| N,N-dimethylamino ethanol | 0.2 |

After confirming that a polymerization degree of the total monomers further added in a polymerization system has reached 100%, a polymerization equipment was cooled.

After the resulting core/shell type particle having a three-dimensionally crosslinked structure was cooled, an emulsion was poured into an aqueous calcium chloride solution to precipitate a polymer, which was rinsed with water and dried under vacuum at 50° C. for 12 hours. The particle size of the resulting particle was measured. It was 230 nm after the synthesis of the core portion and was 250 nm after the synthesis of the shell portion. The particle size distribution was 250±15 nm. Further, the particle was observed by electron microscopy and, as a result, it was confirmed that the particles have an uniform particle size. The physical properties of the resin particle are shown in Table 1, below.

Example 2

By using the following monomers and a reagent for polymerization, a core portion was polymerized. The polymerization was conducted in a 5 liter autoclave at 10° C.

| Component | Parts |
| --- | --- |
| 1,3-Butadiene | 1000 |
| Water | 2000 |
| Dismutated potassium rosinate | 30 |
| Sodium alkyl sulfonate | 1.5 |
| Phosphoric acid | 0.9 |
| Potassium hydroxide | 1.6 |
| Sodium ethylenediaminetetracetate | 0.7 |
| Ferroussulfate heptahydrate | 0.5 |
| Sodium formaldehyde sulfoxylate | 1.5 |
| t-Dodecyl mercaptan | 1.8 |
| p-Methane hydroperoxide | 1.0 |

At the time that a polymerization degree has reached 60% based on the total monomers, the polymerization was terminated by adding 1.5 parts of diethylhydroxylamine. Then, according to a normal method, a non-reacted monomer was removed. A gelation degree of the resulting emulsion of the core portion was measured according to a normal method. No gel portion was observed.

Thereafter, by using the following monomers and a reagent for polymerization, a shell portion was polymerized. The polymerization was conducted after a part of the emulsion of the core portion was transferred to a 2 liter glass reaction vessel.

| Component | Parts |
| --- | --- |
| Emulsion of core portion | 550 |
| Methyl methacrylate | 40 |
| Ethylene glycol dimethacrylate | 8 |
| Water | 250 |
| 4,4'-Azobisisocyanovaleric acid | 0.6 |
| N,N-dimethylamino ethanol | 0.4 |

After confirming that a polymerization degree of the total monomers further added in a polymerization system has reached 100%, a polymerization system was cooled. Then, this core/shell emulsion was dried by a freeze-dryer to obtain a powdered resin.

The thermal properties of the resulting resin was measured by a 8dynamic mechanical analysis (DMA) method. As shown in FIG. 1, peaks which correspond to Tg of the core and shell portion were observed, respectively. Tg of the core portion equals to that measured before the polymerization of the shell part and no change was observed in Tg by the polymerization of the shell portion. Further, it is different from a curve of storage modulus of a product obtained by physically mixing a resin of core/shell portion. Therefore, it was confirmed that a core/shell structure was formed. On the other hand, when a monomer of the shell portion is added during the polymerization of the core portion, a synthesized resin has no core/shell structure, whereby, a copolymer of a monomer for the core portion with a monomer for the shell portion, or a state wherein a matrix of the core portion and a matrix of the shell portion are mixed was formed, as shown in FIG. 2.

Example 3

By using the emulsion for core of polybutadiene synthesized in Example 2 and using the following monomers and a reagent for polymerization, a shell portion was polymerized. The polymerization was conducted after a part of the emulsion for core was transferred to a 2 liter glass reaction vessel.

| Component | Parts |
| --- | --- |
| Emulsion of core portion | 550 |
| Methyl methacrylate | 7 |
| Methacrylic acid | 3 |
| 2-Hydroxyethyl methacrylate | 4 |
| Divinylbenzene | 2 |

| Component | Parts |
| --- | --- |
| Water | 250 |
| 4,4'-Azobisisocyanovaleric acid | 0.3 |
| N,N-dimethylamino ethanol | 0.2 |

After confirming that a polymerization degree of the total monomers further added in a polymerization system has reached 100%, a polymerization system was cooled. After cooling, an emulsion was poured into an aqueous calcium chloride solution to precipitate a polymer, which was rinsed with water and dried under vacuum at 50° C. for 12 hours.

Example 4

By using a commercially available post-emulsified polyisoprene latex and using the following monomers and a reagent for polymerization, a shell portion was polymerized. The polymerization was conducted after polyisoprene latex for core was charged into a 2 liter glass reaction vessel.

| Component | Parts |
| --- | --- |
| Latex of core portion (solid content: 61%, non-gel) | 275 |
| Styrene | 68.47 |
| Acrylonitrile | 34.23 |
| Hydroxypropyl acrylate | 17.12 |
| Trimethylolpropane triacrylate | 47.93 |
| Water | 700 |
| 2,2'-Azobis(2-methyl-N-[1,1-bis(hydroxymethyl)-2-hydroxyethyl]propionamide) | 3 |

After confirming that a polymerization degree of the total monomers further added in a polymerization system has reached 100%, a polymerization system was cooled. After cooling, an emulsion was poured into an aqueous calcium chloride solution to precipitate a polymer, which was rinsed with water and dried under vacuum at 50° C. for 12 hours.

Example 5

By using the following monomers and a reagent for polymerization, a core portion was polymerized. The polymerization was conducted in a 2 liter glass reaction vessel at 80° C.

| Component | Parts |
| --- | --- |
| N-Butyl acrylate | 90 |
| Styrene | 3 |
| Methyl methacrylate | 5 |
| Ethylene glycol dimethacrylate | 2 |
| Water | 300 |
| Sodium dodecylbenzenesulfonate | 2.0 |
| 2,2'-Azobis[2-methyl-N-(2-hydroxyethyl)propionamide | 1.0 |

After confirming that a polymerization degree of the total monomers added to a polymerization system has reached 100%, a polymerization system was cooled.

Thereafter, by using the following monomers and a reagent for polymerization, a shell part was polymerized. The polymerization was continuously conducted in the 2 liter glass reaction vessel containing the emulsion of the core portion.

| Component | Parts |
| --- | --- |
| Emulsion of core portion | 403.0 |
| n-Butyl acrylate | 41.0 |
| Methyl methacrylate | 15.7 |
| Ethylene glycol dimethacrylate | 10.0 |
| Water | 200.0 |
| 4,4'-Azobisisocyanovaleric acid | 0.6 |
| N,N-dimethylamino ethanol | 0.4 |

After confirming that a polymerization degree of the total monomers further added in a polymerization system has reached 100.%, a polymerization system was cooled. After cooling, an emulsion was poured into an aqueous calcium chloride solution to precipitate a polymer, which was rinsed with water and dried under vacuum at 50° C. for 12 hours.

Example 6

By using the following monomers and a reagent for polymerization, a core portion was polymerized. The polymerization was conducted in a 5 liter autoclave at 30° C.

| Component | Parts |
| --- | --- |
| 1,3-Butadiene | 1000 |
| Divinylbenzene | 60 |
| Water | 2000 |
| Dismutated potassium rosinate | 45 |
| Sodium alkyl sulfonate | 1.5 |
| Phosphoric acid | 0.9 |
| Potassium hydroxide | 1.6 |
| Sodium ethylenediaminetetracetate | 0.7 |
| Ferrous sulfate heptahydrate | 0.5 |
| Sodium formaldehyde sulfoxylate | 1.5 |
| t-Dodecyl mercaptan | 1.8 |
| p-Methane hydroperoxide | 1.0 |

After confirming that a polymerization degree of the total monomers added in a polymerization system has reached 100%, a polymerization system was cooled.

Thereafter, by using the following monomers and a reagent for polymerization, a shell portion was polymerized. The polymerization was conducted after a part of the emulsion of the core portion was transferred to a 2 liter glass reaction vessel.

| Component | Parts |
| --- | --- |
| Emulsion of core portion | 840 |
| Methyl methacrylate | 10 |
| 2-Hydroxymethyl methacrylate | 2 |
| Ethylene glycol dimethacrylate | 3 |
| Water | 300 |
| 4,4'-Azobisisocyanovaleric acid | 0.6 |
| N,N-dimethylamino ethanol | 0.4 |

After confirming that a polymerization degree of the total monomers further added in a polymerization system has reached 100%, a polymerization system was cooled.

After cooling, an emulsion was poured into an aqueous calcium chloride solution to precipitate a polymer, which was rinsed with water and dried under vacuum at 50° C. for 12 hours.

Example 7

By using the following monomers and a reagent for polymerization, a core portion was polymerized. The polymerization was conducted in a 5 liter autoclave at 30° C.

| Component | Parts |
| --- | --- |
| 1,3-Butadiene | 1000 |
| Ethylene glycol dimethacrylate | 30 |
| Water | 2000 |
| Dismutated potassium rosinate | 45 |
| Sodium alkyl sulfonate | 1.5 |
| Phosphoric acid | 0.9 |
| Potassium hydroxide | 1.6 |
| Sodium ethylenediaminetetracetate | 0.7 |
| Ferrous sulfate heptahydrate | 0.5 |
| Sodium formaldehyde sulfoxylate | 1.5 |
| t-Dodecyl mercaptan | 1.6 |
| p-Methane hydroperoxide | 1.0 |

After confirming that a polymerization degree of the total monomers added in a polymerization system has reached 100%, a polymerization system was cooled.

Thereafter, by using the following monomers and a reagent for polymerization, a shell portion was polymerized. The polymerization was conducted after a part of the emulsion of the core portion was transferred to a 2 liter glass reaction vessel.

| Component | Parts |
| --- | --- |
| Emulsion of core portion | 840 |
| Methyl methacrylate | 80.16 |
| Methacrylic acid | 24.05 |
| Ethylene glycol dimethacrylate | 16.03 |
| Water | 650 |
| 4,4'-Azobisisocyanovaleric acid | 1.8 |
| N,N-dimethylamino ethanol | 1.2 |

After confirming that a polymerization degree of the total monomers further added in a polymerization system has reached 100%, a polymerization system was cooled.

After cooling, an emulsion was poured into an aqueous calcium chloride solution to precipitate a polymer, which was rinsed with water and dried under vacuum at 50° C. for 12 hours.

Example 8

By using a commercially available polybutadiene latex (N.V. 52%; average particle size: 290 nm; gel content: 5%) and using the following monomers and a reagent for polymerization, a shell portion was polymerized. The polymerization was conducted after the polybutadiene latex for core was charged into a 2 liter glass reaction vessel,

| Component | Parts |
| --- | --- |
| Latex for core portion (N.V. 52%) | 300 |
| Ethyl methacrylate | 98.1 |
| Methacrylic acid | 29.5 |
| Ethylene glycol dimethacrylate | 28.4 |
| Water | 600 |
| 2,2'-Azobis[2-methyl-N-(2-hydroxyethyl)propionamide | 1.5 |

After confirming that a polymerization degree of the total monomers further added in a polymerization system has reached 100%, a polymerization system was cooled. After cooling, an emulsion was poured into an aqueous potassium chloride solution to precipitate a polymer, which was rinsed with water and dried under vacuum at 50° C. for 12 hours.

Comparative Example 1

By using a commercially available polybutadiene latex (N.V. 52%; average particle size: 290 nm; gel content: 5%) used in Example 8 and using the following monomers and a reagent for polymerization, a shell portion was polymerized. The polymerization was conducted after the latex for core was charged into a 2 liter glass reaction vessel.

| Component | Parts |
| --- | --- |
| Latex for core portion (N.V. 52%) | 300 |
| Ethyl methacrylate | 119.9 |
| Methacrylic acid | 36.1 |
| Water | 400 |
| 2,2'-Azobis[2-methyl-N-(2-hydroxyethyl)propionamide | 1.5 |

After confirming that a polymerization degree of the total monomers further added in a polymerization system has reached 100%, a polymerization system was cooled. After cooling, an emulsion was poured into an aqueous potassium chloride solution to precipitate a polymer, which was rinsed with water and dried under vacuum at 50° C. for 12 hours.

Comparative Example 2

By using the following monomers and a reagent for polymerization, a polymerization was initiated. The polymerization was conducted in a 5 liter autoclave at 30° C.

| Component | Parts |
| --- | --- |
| 1,3-Butadiene | 1000 |
| Ethylene glycol dimethacrylate | 29 |
| Methyl methacrylate | 286 |
| Methacrylic acid | 43 |
| Water | 2650 |
| Dismutated potassium rosinate | 45 |
| Sodium alkyl sulfonate | 1.5 |
| Phosphoric acid | 0.9 |
| Potassium hydroxide | 1.6 |
| Sodium ethylenediaminetetracetate | 0.7 |
| Ferrous sulfate heptahydrate | 0.5 |
| Sodium formaldehyde sulfoxylate | 1.5 |
| t-Dodecyl mercaptan | 1.8 |
| p-Methane hydroperoxide | 1.2 |

At the time that a polymerization degree of the total monomers added in a polymerization system has reached 55%, the following monomers were further added.

| Additional monomer | Parts |
| --- | --- |
| Ethylene glycol dimethacrylate | 29 |
| Methacrylic acid | 43 |

Thereafter, the polymerization was continued at 30° C. After confirming that a polymerization degree of the total monomers incorporated into an autoclave has reached 100%, a polymerization system was cooled. After cooling, an emulsion was poured into an aqueous calcium chloride solution to precipitate a polymer, which was rinsed with water and dried under vacuum at 50° C for 12 hours.

TABLE 1

|  | Ex. 1 | Ex. 2 | Ex. 3 | Ex. 4 | Ex. 5 | Ex. 6 | Ex. 7 | Ex. 8 | Comp. Ex. 1 | Comp. Ex. 2 |
|---|---|---|---|---|---|---|---|---|---|---|
| Core/Shell portion | 80/20 | 74/26 | 90/10 | 50/50 | 60/40 | 95/5 | 70/30 | 50/50 | 50/50 | — |
| Core portion | non-gel | non-gel | non-gel | non-gel | gel | gel | gel | gel | gel | — |
| Shell portion | gel | gel | gel | gel | gel | gel | gel | gel | non-gel | — |
| Particle size (nm) | 250 | 270 | 260 | 450 | 150 | 120 | 100 | 300 | 330 | 105 |
| Particle size distribution | one peak | one peak | one peak | one peak | one peak | one peak | one peak | one peek | one peak | one peak |
| Tg of core portion (°C.) | −45 | −80 | −80 | −55 | −10 | −47 | −40 | −70 | −70 | — |
| Tg of shell portion (°C.) | 155 | 180 | 185 | 170 | 35 | 150 | 145 | 140 | 93 | — |

Example 9

To 50 parts by weight of a resin synthesized in Example 8 were added 10 parts by weight of N,N-dimethylaminopropyl methacrylamide, 18 parts by weight of 1,6-hexanediol diacrylate, 20 parts by weight of polyethylene glycol dimethacrylate, 1.5 parts by weight of 2,2-dimethoxy-2-phenylacetophenone and 0.5 parts by weight of 2,6-di-t-butyl-4-methylphenol. The mixture was then mixed well with a pressurized biaxial kneader. The obtained photopolymerizable composition was extruded with a kneader extruder, having a T die, onto a polyester film which was first coated to a thickness of 5 μm with an adhesive to obtain a photosensitive resin plate having about a 1.7 mm photosensitive resin layer. A surface adhesion of the unexposed printing plate was measured by a surface shape measuring machine and changes in a thickness (solid retention) of the plate were measured under constant load. The resin surface of the obtained resin plate was contacted with a negative film having suitable images under vacuum and exposed to an ultraviolet lamp of 350 W for 10 minutes. It was then developed with water at 40° C. for one minute, using a washout machine (manufactured by Nippon Densi Seiki Co. as JW-A2-PD) to obtain a printing plate having a relief (0.80 mm) which was faithful to the negative images. Printing was conducted by a flexographic printing machine (manufactured by Nippon Densi Seiki Co.) to obtain a clear printed article. The evaluation results are shown in Table 2, below.

Comparative Example 3

To 50 parts by weight of a resin synthesized in Comparative Example 1 were added 10 parts by weight of N,N-dimethylaminopropyl methacrylamide, 18 parts by weight of 1,6-hexanediol diacrylate, 20 parts by weight of polyethylene glycol dimethacrylate, 1.5 parts by weight of 2,2-dimethoxy-2-phenylacetophenone and 0.5 parts by weight of 2,6-di-t-butyl-4-methylphenol. The mixture was then mixed well with a pressurized biaxial kneader. The obtained photopolymerizable composition was extruded with a kneader extruder, having a T die, onto a polyester film which was first coated to a thickness of 5 μm with an adhesive to obtain a photosensitive resin plate having about a 1.7 mm photosensitive resin layer. It was necessary to raise a set temperature by about 50° C. so as to obtain the same extrusion moldability as that of Example 9. A surface adhesion of the unexposed printing plate was measured by a surface shape measuring machine and changes in a thickness (solid retention) of the plate were measured under constant load. The resin surface of the obtained resin plate was contacted with a negative film having suitable images under vacuum and exposed to an ultraviolet lamp of 350 W for 10 minutes. It was then developed with water at 40° C. for one minute, using a washout machine (manufactured by Nippon Densi Seiki Co. as JW-A2-PD), but developing could not be conducted at all. Thereafter, by extending the developing time to 45 minutes, a printing plate having a relief (0.80 mm) was obtained. However, the obtained image was not faithful to the negative film. Printing was conducted by a flexographic printing machine (manufactured by Nippon Densi Seiki Co.) to obtain a non-clear printed article having low print density order to satisfy predetermined print density, a printing pressure was raised. As a result, dot gain was arisen and a printed article which is faithful to the original plate was not obtained.

Example 10

To 50 parts by weight of a resin synthesized in Example 7 were added 10 parts by weight of N,N-dimethylaminopropyl methacrylamide, 38 parts by weight of 1,6-hexanediol diacrylate, 1.5 parts by weight of 2,2-dimethoxy-2-phenylacetophenone and 0.5 parts by weight of 2,6-di-t-butyl-4-methylphenol. The mixture was then mixed well with a pressurized biaxial kneader. The obtained photopolymerizable composition was extruded with a kneader extruder, having a T die, onto a polyester film which was first coated to a thickness of 5 μm with an adhesive to obtain a photosensitive resin plate having about a 1.7 mm photosensitive resin layer. A surface adhesion of the unexposed printing plate was measured by a surface shape measuring machine and changes in a thickness (solid retention) of the plate were measured under constant load. The resin surface of the obtained resin plate was contacted with a negative film having suitable images under vacuum and exposed to an ultraviolet lamp of 350 W for 10 minutes. It was then developed with water at 40° C. for one minute, using a washout machine (manufactured by Nippon Densi Seiki Co, as JW-A2-PD) to obtain a printing plate having a relief (0.80 mm) which was faithful to the negative images. Printing was conducted by a flexographic printing machine (manufactured by Nippon Densi Seiki Co.) to obtain a clear printed article.

Comparative Example 4

To 50 parts by weight of a resin synthesized in Comparative Example 2 were added 10 parts by weight of N,N-dimethylaminopropyl methacrylamide, 38 parts by weight of 1,6-hexanediol diacrylate, 1.5 parts by weight of 2,2-dimethoxy-2-phenylacetophenone and 0.5 parts by weight of 2,6-di-t-butyl-4-methylphenol. The mixture was then mixed well with a pressurized biaxial kneader. The obtained photopolymerizable composition was extruded with a kneader extruder, having a T die, onto a polyester film which was first coated to a thickness of 5 μm with an adhesive to obtain a photosensitive resin plate having about a 1.7 mm photosensitive resin layer. A surface adhesion of the unexposed printing plate was measured by a surface shape measuring machine and changes in a thickness (solid retention) of the plate were measured under constant load. The resin surface of the obtained resin plate was contacted with a negative film having suitable imager under vacuum and exposed to an ultraviolet lamp of 350 W for 10 minutes. It was then developed with water at 40° C. for one minute, using a washout machine (manufactured by Nippon Densi Seiki Co, as JW-A2-PD), but complete developing could not be conducted. Therefore, by extending the developing time to 3 minutes, a printing plate having a relief (0.80 mm) was obtained. Printing was conducted by a flexographic printing machine (manufactured by Nippon Densi Seiki Co.). As a result, adhesion of an ink was arisen due to adhesion property of the printing material to obtain a slightly dark printed article.

Example 11

To 50 parts by weight of a resin synthesized in Example 1 were added 17 parts by weight of N,N-dimethylaminopropyl methacrylamide, 30 parts by weight of 2,2-bis[4-(methacryloxy polyethoxy)phenyl]propane, 2.5 parts by weight of 2,2-dimethoxy-2-phenylacetophenone, 0.3 parts by weight of 2,6-di-t-butyl-4-methylphenol and 0.2 parts by weight of hydroquinone. The mixture was then mixed well with a pressurized biaxial kneader. The obtained photopolymerizable Composition was extruded with a kneader extruder, having a T die, onto an iron plate substrate having a thickness of 180 μm which was first coated with an adhesive and an anti-light scattering layer to obtain a specular photosensitive resin plate having about a 400 μm photosensitive resin layer. The resin surface of the obtained resin plate was contacted with a negative film having suitable images under vacuum and exposed to a high pressure mercury lamp of 3 KW from the distance of 70 cm. The exposure time comprised a bump-exposure time of 1 second and a main exposure time of 40 seconds. The exposed plate was then developed by spraying neutral water (40° C.) from a spray developing machine at a pressure of 4 kg/cm² for one minute to obtain a relief plate wherein the non-exposed area was eluted into water. The relief plate thus obtained was dried at 110° C. for 2 minutes to obtain a printed plate which was faithful to the negative images. Printing was conducted by a letterpress printing machine which was converted into a machine for emulsion ink to obtain a clear printed article. The evaluation results are shown in Table 3, below.

Example 12

By using a resin synthesized in Example 2, a printing plate was obtained according to the same manner as that described in. Example 10. Printing was conducted by a flexographic printing machine (manufactured by Nippon Densi Seiki Co.) to obtain a clear printed article.

Example 13

By using a resin synthesized in Example 3, a printing plate was obtained according to the same manner as that described in Example 10. Printing was conducted by a flexographic printing machine (manufactured by Nippon Densi Seiki Co.) to obtain a clear printed article,

Example 14

By using a resin synthesized in Example 4, a printing plate was obtained according to the same manner as that described in Example 9. Printing was conducted by a flexographic printing machine (manufactured by Nippon Densi Seiki Co.) to obtain a clear printed article.

Example 15

By using a resin synthesized in Example 5, a printing plate was obtained according to the same manner as that described in Example 9. Printing was conducted by a flexographic printing machine (manufactured by Nippon Densi Seiki Co.) to obtain a clear printed article.

Example 16

By using a resin synthesized in Example 6, a printing plate was obtained according to the same manner as that described in Example 10. Printing was conducted by a flexographic printing machine (manufactured by Nippon Densi Seiki Co.) to obtain a clear printed article.

TABLE 2

|  | Ex. 9 | Comp. Ex. 3 | Ex. 10 | Comp. Ex. 4 |
|---|---|---|---|---|
| Production |  |  |  |  |
| Kneading property | Good | *1 | Good | *1 |
| Extrusion moldability | Good | *2 | Good | Good |
| Properties of printing plate |  |  |  |  |
| Solid retention | *3 | *4 | *3 | *4 |
| Adhesion | Good | Bad | Good | Bad |
| Productivity of printing plate |  |  |  |  |
| Water developability | 1 min. | 45 min. | 1 min. | 3 min. |
| Storage stability | Good | Bad | Good | Good |
| Image quality | Good | Bad | Good | *5 |
| Printability |  |  |  |  |
| Ink transfer property | Good | Low density | Good | Good |
| Ink resistance | Good | Swell | Good | Swell |
| Durability | Good | Good | Good | Bad |

*1: high loading
*2: high temperature is required
*3: small deformation
*4: large deformation
*5: resolution is poor

TABLE 3

|  | Ex. 11 | Ex. 12 | Ex. 13 | Ex. 14 | Ex. 15 | Ex. 16 |
|---|---|---|---|---|---|---|
| Production |  |  |  |  |  |  |
| Kneading property | Good | Good | Good | Good | Good | Good |
| Extrusion moldability | Good | Good | Good | Good | Good | Good |
| Properties of printing plate |  |  |  |  |  |  |
| Solid retention | *3 | *3 | *3 | *3 | *3 | *3 |
| Adhesion | Good | Good | Good | Good | Good | Good |
| Productivity of printing plate |  |  |  |  |  |  |
| Water developability | 45 sec. | 1 min. | 1 min. | 1 min. | 1 min. | 1 min. |
| Storage stability | Good | Good | Good | Good | Good | Good |
| Image quality | Good | Good | Good | Good | Good | Good |
| Printability |  |  |  |  |  |  |
| Ink transfer property | Good | Good | Good | Good | Good | Good |
| Ink resistance | Good | Good | Good | Good | Good | Good |
| Durability | Good | Good | Good | Good | Good | Good |

Surface adhesion:
Determined from ease of rolling of a stainless steel roll, using a surface shape measuring machine.

Solid retention:
Changes in thickness were measured after constant load was applied to a non-exposed printing plate for a predetermined time.

Water developability:
Elution time was measured with water at 40° C., using a washout machine (manufactured by Nippon Densi Seiki Co. as JW-A2-PD).

Storage stability:
After storage at 40° C. for one month, a printing plate was returned to room temperature and then the elution time was measured. The obtained time was compared to an initial elution time.

Image quality:
A printing plate was made using a normal test negative film, remainder of an independent dot and a fine line and a depth of the shadow part were measured. Then, the obtained image was evaluated.

Kneading property:
Ease of kneading (e.g. exotherm, exotherm rate, loading, etc.) was evaluated when a mixture comprising a resin and a monomer component is mixed with a pressured biaxial kneader.

Extrusion moldability:
Ease of extruding (e.g. exotherm, loading, film thickness accuracy, etc.) was evaluated widen the photopolymerizable composition mixed with a pressured biaxial kneader is extruded with a kneader extruder having a T die in a predetermined film thickness.

What is claimed is:

1. A photosensitive resin composition for a flexographic printing plate, comprising:

(a) 10 to 99 parts by weight of a resin particle having an average particle size of 0.01 to 5 µm, said resin particle having a core/shell structure, wherein the shell portion has a three-dimensionally crosslinked structure and the core portion is not crosslinked, said resin particle having a weight ratio of core portion to shell portion of from 20:80 to 99:1, said shell portion being prepared from a mixture of at least one monofunctional monomer or conjugated diene monomer and at least one polyfunctional monomer excluding a conjugated diene monomer, wherein the ratio of the monofunctional:polyfunctional monomers in said shell portion is 70:30 to 95:5, (b) 1 to 90 parts by weight of a compound having a photopolymerizable group, and (c) 0.01 to 10 parts by weight of a photopolymerization initiator, the amounts of the above components (a), (b) and (c) in the photosensitive resin composition being determined based on a total of 100 parts by weight of the above components (a), (b) and (c), wherein the core portion of the resin particle (a) has a Tg of 0° C. or lower, and the shell portion has a Tg of 30° C. or higher.

2. The composition according to claim 1, wherein the resin particle (a) is formed by a two-stage emulsion polymerization process, and wherein the core portion is obtained from at least one monofunctional monomer.

3. The composition according to claim 2, wherein said at least one monofunctional monomer forming the core portion of the resin particle (a) contains an aliphatic conjugated diene monomer, and the amount of the diene monomer is not less than 40% by weight based upon the total amount of the monomer.

* * * * *